United States Patent [19]
Ohno et al.

[11] Patent Number: 5,332,647
[45] Date of Patent: Jul. 26, 1994

[54] POSITIVE-WORKING QUINONE DIAZIDE COMPOSITION CONTAINING N,N',N''-SUBSTITUTED ISOCYANURATE COMPOUND AND ASSOCIATED ARTICLE

[75] Inventors: Hayato Ohno, Ebina; Nobuo Tokutake; Satoshi Niikura, both of Samukawa; Hidekatsu Kohara; Toshimasa Nakayama, both of Chigasaki, all of Japan

[73] Assignee: Tokyo Ohka Kogyo Co., Ltd., Kanagawa, Japan

[21] Appl. No.: 111,179

[22] Filed: Aug. 24, 1993

[30] Foreign Application Priority Data

Aug. 26, 1992 [JP] Japan .................. 4-248947

[51] Int. Cl.$^5$ .................. G03F 7/09; G03F 7/023; G03C 1/61
[52] U.S. Cl. .................. 430/165; 430/191; 430/192; 430/272
[58] Field of Search .................. 430/191, 165, 192, 272

[56] References Cited

U.S. PATENT DOCUMENTS

| | | |
|---|---|---|
| 3,075,979 | 1/1963 | Tazuma et al. |
| 3,531,483 | 9/1970 | Gilles . |
| 3,637,582 | 1/1972 | Gilles . |
| 3,702,837 | 11/1972 | Gilles . |
| 4,377,631 | 3/1983 | Toukhy et al. ............ 430/192 |
| 4,889,789 | 12/1989 | Stahlhofen ............ 430/191 |

FOREIGN PATENT DOCUMENTS

| | | |
|---|---|---|
| 4029242 | 1/1992 | Japan . |
| 4271349 | 9/1992 | Japan . |
| 2180842 | 7/1988 | United Kingdom . |
| 2212933 | 10/1991 | United Kingdom . |

*Primary Examiner*—Charles L. Bowers, Jr.
*Assistant Examiner*—Christopher G. Young
*Attorney, Agent, or Firm*—Henry T. Burke

[57] ABSTRACT

A positive-working photosensitive resin composition useful as a photoresist material in the fine patterning work for the manufacture of semiconductor devices is proposed. The composition is excellent in the storage stability and capable of giving a patterned resist layer having good film thickness retention, cross sectional profile of line patterns, resolution and heat resistance. The composition comprises, in addition to a conventional alkali-soluble novolac resin as a film-forming agent and a quinone diazide group containing compound as a photosensitizing agent, a specific isocyanurate compound substituted at each nitrogen atom with a hydroxy- and ter-butyl-substituted benzyl group.

10 Claims, No Drawings

POSITIVE-WORKING QUINONE DIAZIDE COMPOSITION CONTAINING N,N',N''-SUBSTITUTED ISOCYANURATE COMPOUND AND ASSOCIATED ARTICLE

BACKGROUND OF THE INVENTION

The present invention relates to a novel positive-working photosensitive resin composition or, more particularly, to a positive-working photosensitive resin composition having high photosensitivity and excellent storage stability capable of giving a patterned photoresist layer which is excellent in the film thickness retention by development, orthogonality of cross sectional profile of line patterns, resolution and heat resistance so as to be useful as a photoresist composition for the ultrafine patterning works on a substrate in the manufacture of various kinds of semiconductor devices such as ICs, LSIs and the like.

As is well known, the process of photolithographic patterning is widely practiced in the manufacturing process of semiconductor devices such as ICs, LSIs and the like. In the photolithographic patterning work, a layer of a photoresist composition is formed on the surface of a substrate such as a semiconductor silicon wafer and the photoresist layer is exposed pattern-wise to actinic rays such as ultraviolet light through a transparency mask bearing the desired pattern for the semiconductor device to form a latent image of the pattern which is then developed by using a developer solution to give a patterned resist layer to serve as a protecting mask for the substrate surface in the subsequent treatment of etching and the like. Photoresist compositions are classified into negative-working ones and positive-working ones depending on the behavior of the photosensitive resin composition against irradiation with actinic rays. Positive-working photoresist compositions of the most widely used type are those comprising an alkali-soluble novolac resin as the film-forming constituent and a photosensitizing agent which is a quinone diazide group-containing compound or, in particular, an aromatic polyhydroxy compound esterified with naphthoquinone-1,2-diazide sulfonic acid (see, for example, U.S. Pat. No. 4,377,631 and Japanese Patent Kokai No. 62-35349, No. 1-142548 and No. 1-179147).

It is a trend noteworthy in the technology of semiconductor devices in recent years that the density of integration in a semiconductor device is rapidly increasing year by year requiring an extremely fine photolithographic patterning work with a fineness of as fine as 1.0 μm or even finer in the manufacture of VLSIs and the like. Needless to say, this requirement for fineness can be achieved necessarily as a result of the improvement in the positive-working photoresist composition used therefor, in particular, in respects of the high photosensitivity, film thickness retention by the development treatment, orthogonality of the cross sectional profile of the line pattern, resolution and heat resistance of the patterned resist layer as well as the storage stability of the photosensitive resin composition to contribute to the productivity of the photolithographic process.

None of the prior art positive-working photoresist compositions, however, can meet all of the above mentioned requirements. For example, the film thickness retention by development is generally low in the prior art compositions so that it is a difficult matter to obtain a high contrast of the reproduced image pattern. Along with the increased fineness in the resist pattern, furthermore, the cross sectional profile of the line pattern has a wavy side line, which should desirably be orthogonally straight, as a trend while such a patterned resist layer can no longer work satisfactorily as a protecting mask, for example, in etching.

Several proposals have also been made to formulate a positive-working photoresist composition with various photosensitizing compounds in combination with an object to obtain further enhanced photosensitivity of the composition. Although the photosensitivity of the composition can be increased by increasing the content of photosensitizers, drawbacks are sometimes caused thereby that the storage stability of the composition is decreased and the heat stability of the resist layer after patterning is decreased.

SUMMARY OF THE INVENTION

The present invention accordingly has an object to provide a novel and improved positive-working photosensitive resin composition useful as a photoresist material capable of being in compliance with the requirements in the modern photolithographic patterning technology in the manufacture of semiconductor devices to be freed from the above described problems and disadvantages in the conventional positive-working photoresist compositions. This object can be achieved by compounding a mixture consisting of an alkali-soluble novolac resin as a film-forming constituent and a quinone diazide group-containing compound as a photosensitizing agent with a very specific isocyanurate compound which has been discovered after the extensive investigations undertaken by the inventors.

Thus, the positive-working photosensitive resin composition of the present invention is a uniform mixture which comprises:

(a) a quinone diazide group-containing compound as a photosensitizing agent;

(b) an alkali-soluble novolac resin as a film-forming agent; and (c) an N,N', N''-substituted isocyanurate compound represented by the general formula

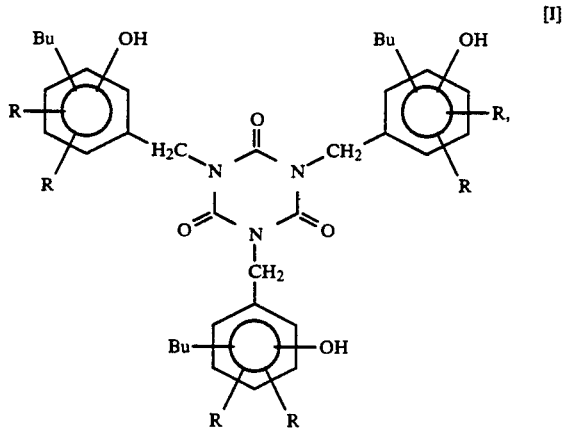

[I]

in which Bu denotes a tert-butyl group and the groups denoted by R are, each independently from the others, a hydrogen atom, a hydroxy group or an alkyl group having 1 to 4 carbon atoms.

DETAILED DESCRIPTION OF THE PREFERRED EMBODIMENTS

As is understood from the above given description, the most characteristic feature of the inventive positive-working photosensitive resin composition consists in the formulation of the very specific compound represented by the general formula (I), which is an N,N',N''-substituted isocyanurate compound, as an additive to the mixture consisting of a film-forming agent and a photosensitizing agent.

The photosensitizing agent used in the inventive positive-working photoresist composition is a quinone diazide group-containing compound. Examples of such a compound include full or partial esterification products of naphthoquinone-1,2-diazide-5- or naphthoquinone-1,2-diazide-4-sulfonic acid with a polyhydroxy aromatic compound such as polyhydroxy benzophenone compounds, e g., 2,3,4-trihydroxy benzophenone and 2,3,4,4'-tetrahydroxy benzophenone, 1-[1-(4-hydroxyphenyl) isopropyl]-4-[1,1-bis(4-hydroxyphenyl)ethyl] benzene and tris(hydroxyphenyl) methanes and methyl-substituted compounds thereof disclosed in Japanese Patent Kokai No. 4-29242, e.g., tris(4-hydroxyphenyl) methane, bis(4-hydroxy-3,5-dimethylphenyl)-4-hydroxyphenyl methane, bis(4-hydroxy-2,5-dimethylphenyl)-4-hydroxyphenyl methane, bis(4-hydroxy-3,5-dimethylphenyl)-2-hydroxyphenyl methane and bis(4-hydroxy-2,5-dimethylphenyl)-2-hydroxyphenyl methane. In particular, the full or partial esterification products of 1-[1-(4-hydroxyphenyl) isopropyl]-4-[1,1-bis(4-hydroxyphenyl)ethyl] benzene and tris(hydroxyphenyl) methanes and methyl-substituted compounds thereof with naphthoquinone-1,2-diazide-5- or naphthoquinone-1,2-diazide-4-sulfonic acid are preferred as the photosensitizing agent having high sensitivity to excimer laser beams and far ultraviolet light. Besides the above named ones, other quinone diazide group-containing compounds usable as the photosensitizing agent include o-benzoquinone diazide, o-naphthoquinone diazide, o-anthraquinone diazide and o-naphthoquinone diazide sulfonic acid esters as well as nucleus-substituted derivatives thereof and reaction products of o-quinone diazide sulfonyl chloride and a compound having a hydroxy group or amino group in the molecule such as phenol, p-methoxy phenol, dimethyl phenol, hydroquinone, bisphenol A, naphthol, pyrocatechol, pyrogallol, pyrogallol monomethyl ether, pyrogallol 1,3-dimethyl ether, gallic acid, gallic acid partially esterified or etherified leaving a part of the hydroxy groups, aniline, p-amino diphenyl amine and the like. The above described quinone diazide group-containing compounds as the photosensitizing agent can be used either singly or as a combination of two kinds or more according to need.

The above described compounds as the photosensitizing agent can be synthetically prepared in the following manner. Thus, the above named polyhydroxy aromatic compound and naphthoquinone-1,2-diazide-5- or naphthoquinone-1,2-diazide-4-sulfonyl chloride are dissolved in a suitable organic solvent such as dioxane and subjected to a full or partial esterification reaction in the presence of an alkali such as triethanolamine, alkali carbonate and alkali hydrogen carbonate as an acceptor of hydrogen chloride.

It is optional in order to further improve the photosensitivity of the composition that the above described photosensitizing agent in the inventive resist composition is further combined with the above mentioned 1-[1-(4-hydroxyphenyl) isopropyl]-4-[1,1-bis(4-hydroxyphenyl) ethyl] benzene or a tris(hydroxyphenyl) methane or methyl-substituted derivative thereof.

It is of course optional that the photosensitizing agent in the inventive resist composition is combined with a limited amount of other sensitizer compounds such as mercaptooxazole, mercaptobenzoxazole, mercaptooxazoline, mercaptobenzothiazole, benzoxazoline, benzothiazolone, mercaptobenzimidazole, urazole, thiouracyl, mercaptopyrimidine and imidazolone as well as derivatives thereof.

The most characteristic ingredient in the inventive positive-working photoresist composition is the component (c) which is an isocyanurate compound represented by the general formula (I) given above. Examples of suitable isocyanurate compounds include 1,3,5-tris(4-tert-butyl-3-hydroxy-2,6-dimethyl benzyl) isocyanurate, 1,3,5-tris(4-tert-butyl-3-hydroxy-2,6-diethyl benzyl) isocyanurate, 1,3,5-tris(3,5-di-tert-butyl-4-hydroxy benzyl) isocyanurate and the like. These isocyanurate compounds can be used either singly or as a combination of two kinds or more according to need. The isocyanurate compounds suitable as the component (c) in the inventive composition can be synthesized according to the procedure described, for example, in Japanese Patent Publication No. 46-35041 and U.S. Pat. No. 3,075,979. Commercially available isocyanurate compounds can also be used for the purpose including those sold under the tradenames of Cyanox 1790 (a product by Cyanamid Co.) and Adekastab AO-20 (a product by Asahi Denka Co.).

The above described isocyanurate compound represented by the general formula (I) not only exhibits a photosensitizing effect but also has an effect to promote dissolution of the composition in the areas exposed to the actinic rays and to suppress dissolution of the composition in the areas unexposed to the actinic rays in the developer solution. In other words, this component (c) has an effect to enhance the selectivity of the resist layer relative to the solubility in the developer solution so as to give a patterned resist layer having excellent film thickness retention after development. Since the above mentioned desirable effects can be obtained with only a small amount of the component (c) contained in the inventive photoresist composition, no adverse influences are caused by the admixture thereof on the heat resistance of the patterned resist layer formed from the composition. When the alkali-soluble novolac resin as the film-forming constituent in the inventive composition has a relatively high weight-average molecular weight, the patterned resist layer can possibly be imparted with further improved heat resistance and an increased latitude relative to the exposure dose by virtue of the use of this unique component (c).

The film-forming ingredient in the inventive positive-working photosensitive resin composition is an alkali-soluble novolac resin which is not particularly limitative including those conventionally used in the positive-working photoresist compositions. Namely, the alkali-soluble novolac resin can be prepared by the condensation reaction of an aromatic hydroxy compound such as phenol, cresol and xylenol with an aldehyde such as formaldehyde in the presence of an acidic catalyst. It is preferable in respect of the heat resistance of the patterned resist layer of the resin composition that the novolac resin has a weight-average molecular weight in the range from 2000 to 20000 or, more preferably, from 5000 to 15000 after removal of the low molecular-weight species by fractionation.

As to the formulation of the inventive photosensitive resin composition, the amount of the alkali-soluble novolac resin as the component (a) is in the range, usually, from 5 to 200 parts by weight or, preferably, from 10 to 60 parts by weight per 10 parts by weight of the photosensitizing agent as the component (b). When the amount of the component (b) is too small relative to the component (a), a decrease is caused in the fidelity of the reproduced pattern to the pattern on the photomask. When the amount of the component (b) is too large, on the other hand, the resist layer of the composition formed on a substrate surface would be poor in the uniformity along with a decrease in the resolution of fine patterns.

The amount of the isocyanurate compound as the component (c) in the inventive composition is in the range, usually, from 0.5 to 15 parts by weight or, preferably, from 1.0 to 10 parts by weight per 100 parts by weight of the total amount of the alkali-soluble novolac resin as the component (a) and the photosensitizing agent as the component (b). When the amount of the component (c) is too small, the desired effect of improvement in the film thickness retention of the patterned resist layer by development cannot be fully exhibited while no additional advantages can be obtained by increasing the amount thereof to exceed the above mentioned upper limit rather with an economical disadvantage due to the expensiveness of the isocyanurate compound. The optimum amount of the component (c) largely depends on the types of the photosensitizing agent.

The photosensitive resin composition of the invention is usually prepared in the form of a solution by dissolving the essential and optional ingredients in a suitable organic solvent in order to facilitate the coating works therewith. Examples of suitable organic solvents include: ketones such as acetone, methyl ethyl ketone, cyclohexanone, methyl isoamyl ketone and 1,1,1-trimethyl acetone; polyhydric alcohols and derivatives thereof such as ethyleneglycol, ethyleneglycol monoacetate, diethyleneglycol and diethyleneglycol monoacetate as well as monomethyl ethers, monoethyl ethers, monopropyl ethers, monobutyl ethers and monophenyl ethers thereof; cyclic ethers such as dioxane; and esters such as ethyl lactate, methyl acetate, ethyl acetate, butyl acetate, methyl pyruvate, ethyl pyruvate and ethyl 3-ethoxy propionate. These organic solvents can be used either singly or as a combination of two kinds or more according to need.

When the above mentioned optional photosensitizing compounds are used in combination with the component (b), the amount of the optional photosensitizing compounds is limited not to exceed, usually, 30% by weight or, preferably 25% by weight based on the total amount of the components (a) and (b). No particular additional advantages can be obtained by increasing the amount of these optional photosensitizing compounds to exceed the above mentioned upper limit.

It is of course optional that the inventive positive-working photosensitive resin composition is further admixed with each a limited amount of various kinds of known additives including auxiliary resins to improve the film properties of the resist layer, plasticizers, stabilizers and coloring agents to improve the visibility of the patterned resist layer after development.

Following is a brief description of a typical procedure of the photolithographic patterning work by using the inventive positive-working photosensitive resin composition. Thus, a substrate such as a semiconductor silicon wafer is uniformly coated with the photoresist composition in the form of a coating solution prepared by dissolving the essential and optional ingredients in an organic solvent by using a suitable coating machine such as a spinner followed by drying to form a photosensitive resist layer which is exposed pattern-wise to actinic rays, for example, by the exposure to ultraviolet light emitted from a low-pressure mercury lamp, high-pressure mercury lamp, ultrahigh-pressure mercury lamp, arc lamp, xenon lamp and the like, far ultraviolet light or excimer laser beams through a desired patterned photomask or by the irradiation with an electron beam scanned along a desired pattern to form a patterned latent image. The next step is a development treatment of the latent image by immersing the resist layer on the substrate in a developer solution which is a weakly alkaline aqueous solution of an organic basic compound such as tetramethyl ammonium hydroxide in a concentration of 1 to 10% by weight so that the resist layer in the exposed areas is dissolved away in the developer solution to leave the resist layer in the unexposed areas forming a patterned resist layer having high fidelity to the pattern on the photomask.

In the following, the positive-working photosensitive resin composition of the invention is illustrated in more detail by way of examples as preceded by Preparation Examples describing the synthetic procedure of the photosensitizing agents used in the Examples. In the examples, the photosensitive resin compositions prepared there were evaluated for the items given below by the respective testing procedures described there.

(1) Photosensitivity:

A semiconductor silicon wafer was coated on one surface with a coating solution of the resin composition by using a spinner followed by drying for 90 seconds on a hot plate kept at 110° C. to give a dried resist layer having a uniform thickness of 1.3 μm. The resist layer was exposed pattern-wise to ultraviolet light on a minilying light-exposure machine (Model NSR-1505G4D, manufactured by Nikon Co., NA=0.45) in Examples 1 to 6 and Comparative Examples 1 and 2, to an excimer laser beam on a laser-beam minilying light-exposure machine in Examples 7 to 9 and to i-line ultraviolet light on a minilying exposure machine (Model NSR-1755i7A, manufactured by Nikon Co., NA=0.50) in Examples 10 to 12 for an exposure time varied stepwise from 0.1 second with each 0.01 second increment followed by a development treatment for 1 minute in a 2.38% by weight aqueous solution of tetramethyl ammonium hydroxide at 23° C., rinsing in running water for 30 seconds and drying to give a patterned resist layer. Recording was made for the minimum exposure time in milli-seconds (Examples 1 to 6 and 10 to 12 and Comparative Examples 1 and 2) or in ms/cm$^2$ (Examples 7 to 9) by which a patterned resist layer of high fidelity could be obtained as a measure of the photosensitivity of the composition.

(2) Film thickness retention:

Measurements were performed in the resist layer patterned in the above described manner for the thickness of the resist layer in the unexposed areas before and after the development treatment. Recording was made of the ratio of the thickness after the development treatment to the thickness before the development treatment.

(3) Heat resistance

The silicon wafer bearing the patterned resist layer was heated for 5 minutes on a hot plate kept at 120° C., 130° C. or 140° C. and occurrence of deformation of the pattern was microscopically examined. Record was made for the highest temperature at which absolutely no deformation in the patterned resist layer was detected after 5 minutes of heating.

(4) Storage stability

The coating solution of the photosensitive resin composition was kept standing at room temperature in a hermetically sealed container for one month or for six months and visually inspected for the appearance of precipitates in the solution. The results were recorded as "poor" or "good" when precipitates in the solution were detected after one month or not detected after six months, respectively.

(5) Cross sectional profile of line pattern

Microscopic observation was undertaken for the cross section of a line pattern having a width of 0.5 μm as formed in the above described manner. The cross sectional profile was recorded as "good" or "poor" when the cross section had smooth side lines and when the side lines of the cross sectional profile were rugged, respectively.

(6) Resolution

The limiting resolution was determined at a light exposure dose sufficient to reproduce a line pattern on the photomask having a line width of 1.0 μm.

PREPARATION EXAMPLE 1

Into a mixture of 240 g of dioxane and 37 g of N-methyl pyrrolidone were dissolved 9.8 g (0.04 mole) of 2,3,4,4'-tetrahydroxy benzophenone and 45.6 g (0.17 mole) of naphthoquinone-1,2-diazide-5-sulfonyl chloride to form a solution, into which a mixture of 70 g of triethanolamine and 210 g of dioxane was added dropwise under vigorous agitation taking 30 to 60 minutes. Agitation was further continued for additional 30 to 60 minutes after completion of the dropwise addition of the triethanolamine solution. Thereafter, the precipitated amine salt was removed by filtration from the reaction mixture and the filtrate was acidified by the addition of 25 g of a 35% hydrochloric acid as diluted with 1000 g of deionized water to precipitate the reaction product which was collected by filtration, thoroughly washed with deionized water, dehydrated and dried.

The thus obtained reaction product containing quinone diazide groups was dissolved in tetrahydrofuran and the solution was subjected to liquid-chromatographic separation into fractions, of which the ultraviolet absorption spectra were taken at and around the peak wavelength of 310 nm to find that the reaction product was composed of 94%, 4% and 2% by weight of the tetraester, diester and monoester, respectively, from the peak areas.

PREPARATION EXAMPLE 2

Into 340 g of dioxane were dissolved 9.2 g (0.04 mole) of 2,3,4-trihydroxy benzophenone and 26.8 g (0.10 mole) of naphthoquinone-1,2-diazide-5-sulfonyl chloride to form a solution, into which 24 g of a 25% by weight aqueous solution of sodium carbonate were added dropwise under vigorous agitation taking 30 to 60 minutes. Agitation was further continued for additional 30 to 60 minutes after completion of the dropwise addition of the sodium carbonate solution. Thereafter, the precipitated sodium chloride was removed by filtration from the reaction mixture and the filtrate was acidified by the addition of 25 g of a 35% hydrochloric acid as diluted with 1000 g of deionized water to precipitate the reaction product which was collected by filtration, thoroughly washed with deionized water, dehydrated and dried.

The thus obtained reaction product containing quinone diazide groups was analyzed in the same manner as in Preparation Example 1 to find that the reaction product was composed of 53.6%, 29.7%, 11.3% and 5.4% by weight of the triester, diester, monoester and unreacted benzophenone compound, respectively, from the peak areas in the ultraviolet absorption spectra.

PREPARATION EXAMPLE 3

Into 4200 g of dimethyl acetamide were dissolved 425 g (1.00 mole) of 1-[1-(4-hydroxyphenyl)isopropyl]-4-[1,1-bis(4-hydroxyphenyl)ethyl] benzene and 817.4 g (3.05 moles) of naphthoquinone-1,2-diazide-4-sulfonyl chloride to form a solution, into which a solution of 350 g of triethylamine in 1400 g of dimethyl acetamide was added dropwise under vigorous agitation taking 30 to 60 minutes. Agitation was further continued for additional 30 to 60 minutes after completion of the dropwise addition of the amine solution. Thereafter, the precipitated amine salt was removed by filtration from the reaction mixture and the filtrate was acidified by the addition of 25 g of a 35% hydrochloric acid as diluted with 1000 g of deionized water to precipitate the reaction product which was collected by filtration, thoroughly washed with deionized water, dehydrated and dried.

The thus obtained reaction product containing quinone diazide groups was analyzed in the same manner as in Preparation Example 1 to find that the content of the triester was almost 100%.

PREPARATION EXAMPLE 4

Into 2000 g of dimethyl acetamide were dissolved 425 g (1.00 mole) of 1-[1-(4-hydroxyphenyl)isopropyl]-4-[1,1-bis(4-hydroxyphenyl)ethyl] benzene and 616 g (2.3 moles) of naphthoquinone-1,2-diazide-4-sulfonyl chloride to form a solution, into which a solution of 120 g of triethylamine in 700 g of dimethyl acetamide was added dropwise under vigorous agitation taking 30 to 60 minutes. The reaction mixture was subsequently treated in the same manner as in Preparation Example 1 to give a reaction poduct, which was analyzed in the same manner as in Preparation Example 1 to find that the contents of the triester, diester, monoester and unreacted starting material were 55.3%, 29.2%, 10.5% and 5% by weight, respectively.

PREPARATION EXAMPLE 5

Into 4200 g of dimethyl acetamide were dissolved 348 g (1.00 mole) of bis(4-hydroxy-3,5-dimethylphenyl)-2-hydroxyphenyl methane and 562.8 g (2.1 moles) of naphthoquinone-1,2-diazide-4-sulfonyl chloride to form a solution, into which a solution of 350 g of triethylamine in 1400 g of dimethyl acetamide was added dropwise under vigorous agitation taking 30 to 60 minutes. Agitation was further continued for additional 30 to 60 minutes after completion of the dropwise addition of the amine solution. Thereafter, the precipitated amine salt was removed by filtration from the reaction mixture and the filtrate was acidified by the addition of 25 g of a 35% hydrochloric acid as diluted with 1000 g of deionized water to precipitate the reaction product which was collected by filtration, thoroughly washed with deionized water, dehydrated and dried.

The thus obtained reaction product containing quinone diazide groups was analyzed in the same manner as in Preparation Example 1 to find that the contents of the triester, diester, monoester and unreacted starting material were 52.3%, 31.2%, 11.5% and 5% by weight, respectively.

PREPARATION EXAMPLE 6

Into 4200 g of dimethyl acetamide were dissolved 292 g (1.00 mole) of tris(4-hydroxyphenyl) methane and 670 g (2.5 moles) of naphthoquinone-1,2-diazide-4-sulfonyl chloride to form a solution, into which a solution of 350 g of triethylamine in 1400 g of dimethyl acetamide was added dropwise under vigorous agitation taking 30 to 60 minutes. Agitation was further continued for additional 30 to 60 minutes after completion of the dropwise addition of the amine solution. Thereafter, the precipitated amine salt was removed by filtration from the reaction mixture and the filtrate was acidified by the addition of 25 g of a 35% hydrochloric acid as diluted with 1000 g of deionized water to precipitate the reaction product which was collected by filtration, thoroughly washed with deionized water, dehydrated and dried.

The thus obtained reaction product containing quinone diazide groups was analyzed in the same manner as in Preparation Example 1 to find that the contents of the triester, diester, monoester and unreacted starting material were 58.3%, 31.2%, 8.5% and 2% by weight, respectively.

EXAMPLE 1

A positive-working photosensitive resin composition was prepared by dissolving 5 g of the photosensitizing agent prepared in Preparation Example 1, 20 g of a cresol novolac resin having a weight-average molecular weight of 12000 and 1 g of 1,3,5-tris(4-tert-butyl-3-hydroxy-2,6-dimethyl benzyl) isocyanurate (Cyanox 1790, a product by Cyanamid Co.) in 75 g of ethyleneglycol monoethyl ether acetate followed by filtration.

The thus prepared coating solution of the photosensitive resin composition was subjected to the evaluation tests as described above to give the results shown in Table 1 to follow.

EXAMPLE 2

The experimental procedure was substantially the same as in Example 1 except that the photosensitizing agent was replaced with the same amount of the product prepared in Preparation Example 2.

The results of the evaluation tests of this photosensitive resin composition are shown also in Table 1.

EXAMPLES 3 TO 6

The experimental procedure in each of these examples was substantially the same as in Example 1 except that the amount of the isocyanurate compound was varied to 0.3 g, 0.5 g, 2 g and 3 g by weight, respectively.

The results of the evaluation tests of these photosensitive resin compositions are shown also in Table 1.

COMPARATIVE EXAMPLE 1

The experimental procedure was substantially the same as in Example 1 excepting omission of the isocyanurate compound.

The results of the evaluation tests of this comparative photosensitive resin composition are shown also in Table 1.

COMPARATIVE EXAMPLE 2

The experimental procedure was substantially the same as in Example 1 except that the isocyanurate compound was replaced with the same amount of benzothiazolone.

The results of the evaluation tests of this comparative photosensitive resin composition are shown also in Table 1.

EXAMPLE 7

The experimental procedure was substantially the same as in Example 1 except that the photosensitizing agent was replaced with the same amount of the product prepared in Preparation Example 3 and excimer laser beam irradiation was undertaken instead of the ultraviolet exposure.

The results of the evaluation tests of this photosensitive resin composition are shown also in Table 1.

EXAMPLE 8

The experimental procedure was substantially the same as in Example 7 described above except that the photosensitive resin composition was further admixed with 2 g of 1-[1-(4-hydroxyphenyl) isopropyl]-4-[1,1-bis(4-hydroxyphenyl) ethyl] benzene.

The results of the evaluation tests of this photosensitive resin composition are shown also in Table 1.

EXAMPLE 9

The experimental procedure was substantially the same as in Example 7 except that the photosensitizing agent was replaced with 5 g of the product prepared in Preparation Example 4.

The results of the evaluation tests of this photosensitive resin composition are shown also in Table 1.

EXAMPLE 10

The experimental procedure was substantially the same as in Example 1 described above except that the photosensitive resin composition was replaced with the same amount of the product obtained in Preparation Example 4.

The results of the evaluation tests of this photosensitive resin composition are shown also in Table 1.

EXAMPLE 11

The experimental procedure was substantially the same as in Example 10 except that the photosensitizing agent was replaced with the same amount of the product prepared in Preparation Example 5.

The results of the evaluation tests of this photosensitive resin composition are shown also in Table 1.

EXAMPLE 12

The experimental procedure was substantially the same as in Example 10 except that the photosensitizing agent was replaced with the same amount of the product prepared in Preparation Example 6.

The results of the evaluation tests of this photosensitive resin composition are shown also in Table 1.

TABLE 1

| | Photosensitivity | Film thickness retention, % | Heat resistance, °C. | Storage stability | Cross sectional profile | Resolution, μm |
|---|---|---|---|---|---|---|
| Example 1 | 300 ms | 99.5 | 140 | Good | Good | 0.50 |
| Example 2 | 260 ms | 97.5 | 140 | Good | Good | 0.50 |
| Example 3 | 210 ms | 96.8 | 140 | Good | Good | 0.55 |
| Example 4 | 240 ms | 98.3 | 140 | Good | Good | 0.50 |
| Example 5 | 300 ms | 99.8 | 140 | Good | Good | 0.50 |
| Example 6 | 350 ms | 99.8 | 140 | Good | Good | 0.55 |
| Comparative Example 1 | 650 ms | 85.7 | 140 | Good | Poor | 0.70 |
| Comparative Example 2 | 550 ms | 85.0 | 130 | Good | Poor | 0.80 |
| Example 7 | 50 ms/cm$^2$ | 99.5 | 140 | Good | Good | 0.35 |
| Example 8 | 40 ms/cm$^2$ | 98.7 | 140 | Good | Good | 0.38 |
| Example 9 | 60 ms/cm$^2$ | 99.3 | 140 | Good | Good | 0.35 |
| Example 10 | 400 ms | 99.8 | 140 | Good | Good | 0.50 |
| Example 11 | 350 ms | 99.6 | 140 | Good | Good | 0.48 |
| Example 12 | 330 ms | 99.5 | 140 | Good | Good | 0.50 |

What is claimed is:

1. A positive-working photosensitive resin composition which comprises, as a uniform mixture:
   (a) a photosensitive amount of a quinone diazide group-containing compound as a photosensitizing agent;
   (b) for each 10 parts by weight of the photosensitizing agent, from 5 to 200 parts by weight of an alkali-soluble, film forming novolac resin; and
   (c) for each 100 total parts by weight of film forming novolac resin and photosensitizing agent, from 0.5 to 15 parts by weight of an N, N', N''-substituted isocyanurate compound represented by the general formula:

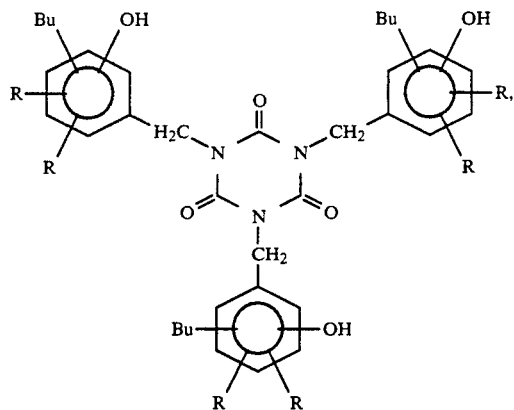

in which Bu denotes a tert-butyl group and the groups denoted by R are, each independently from the others, a hydrogen atom, a hydroxy group or an alkyl group having 1 to 4 carbon atoms.

2. The positive-working photosensitive resin composition as claimed in claim 1 in which the N, N', N''-substituted isocyanurate compound as the component (c) is selected from the group consisting of 1,3,5-tris(4-tert-butyl-3-hydroxy-2,6-dimethyl benzyl) isocyanurate, 1,3,5-tris(4-tert-butyl-3-hydroxy-2,6-diethyl benzyl) isocyanurate and 1,3,5-tris(3,5-di-tert-butyl-4-hydroxy benzyl) isocyanurate.

3. The positive-working photosensitive resin composition as claimed in claim 2 in which the N, N', N''-substituted isocyanurate compound as the component (c) is 1,3,5-tris(4-tert-butyl-3-hydroxy-2,6-dimethyl benzyl) isocyanurate.

4. The positive-working photosensitive resin composition as claimed in claim 1 in which the amount of the alkali-soluble novolac resin as the component (b) is in the range from 10 to 60 parts by weight per 10 parts by weight of the quinone diazide group-containing compound as the component (a).

5. The positive-working photosensitive resin composition as claimed in claim 1 in which the amount of the N, N', N''-substituted isocyanurate compound as the component (c) is in the range from 1.0 to 10 parts by weight per 100 parts by weight of the total amount of the alkali-soluble novolac resin as the component (b) and the quinone diazide group-containing compound as the component (a).

6. A positive-working photoresist comprising a semiconductor silicon wafer coated with a photosensitive resin composition which comprises, as a uniform mixture:
   (a) a photosensitive amount of a quinone diazide group-containing compound as a photosensitizing agent;
   (b) for each 10 parts by weight of the photosensitizing agent, from 5 to 200 parts by weight of an alkali-soluble, film forming novolac resin; and
   (c) for each 100 total parts by weight of film forming novolac resin and photosensitizing agent, from 0.5 to 15 parts by weight of an N, N', N''-substituted isocyanurate compound represented by the general formula:

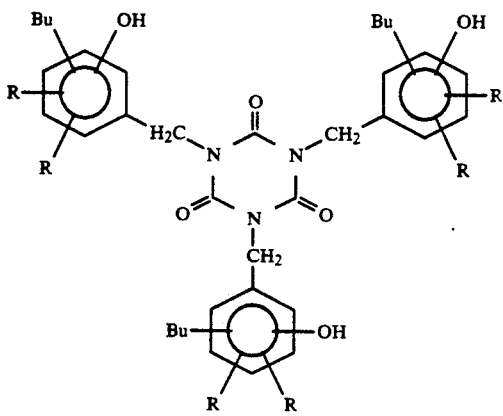

in which Bu denotes a tert-butyl group and the groups denoted by R are, each independently from the others, a hydrogen atom, a hydroxy group or an alkyl group having 1 to 4 carbon atoms.

7. A positive-working photoresist as claimed in claim 6 in which the N, N', N"-substituted isocyanurate compound as the component (c) is selected from the group consisting of 1,3,5-tris(4-tert-butyl-3-hydroxy-2,6-dimethyl benzyl) isocyanurate, 1,3,5-tris(4-tert-butyl-3-hydroxy-2,6-diethyl benzyl) isocyanurate and 1,3,5-tris(3,5-di-tert-butyl-4-hydroxy benzyl) isocyanurate.

8. The positive-working photosensitive as claimed in claim 7 in which the N, N', N"-substituted isocyanurate compound as the component (c) is 1,3,5-tris(4-tert-butyl-3-hydroxy-2,6-dimethyl benzyl) isocyanurate.

9. The positive-working photoresist as claimed in claim 6 in which the amount of the soluble novolac resin as the component (b) is in the range from 10 to 60 parts by weight per 10 parts by weight of the quinone diazide group-containing compound as the component (a).

10. The positive-working photoresist as claimed in claim 6 in which the amount of the N, N', N"-substituted isocyanurate compound as the component (c) is in the range from 1.0 to 10 parts by weight per 100 parts by weight of the total amount of the alkali-soluble novolac resin as the component (b) and the quinone diazide group-containing compound as the component (a).

* * * * *